(12) United States Patent
Leduc et al.

(10) Patent No.: US 6,794,727 B2
(45) Date of Patent: Sep. 21, 2004

(54) SINGLE RECEIVING SIDE CONTACTLESS ELECTRONIC MODULE CONTINUOUS MANUFACTURING PROCESS

(75) Inventors: Michel Leduc, Trets (FR); Philippe Martin, Beaume (FR); Richard Kalinowski, George-Bizet (FR)

(73) Assignee: Gemplus, Gemenos (FR)

( * ) Notice: Subject to any disclaimer, the term of this patent is extended or adjusted under 35 U.S.C. 154(b) by 85 days.

(21) Appl. No.: 10/254,736

(22) PCT Filed: Jan. 27, 1997

(86) PCT No.: PCT/FR97/00098

§ 371 (c)(1),
(2), (4) Date: Oct. 29, 1998

(87) PCT Pub. No.: WO97/26621

PCT Pub. Date: Jul. 24, 1997

(65) Prior Publication Data

US 2003/0025186 A1 Feb. 6, 2003

Related U.S. Application Data

(62) Division of application No. 09/101,049, filed as application No. PCT/FR97/00098 on Jan. 17, 1997, now abandoned.

(30) Foreign Application Priority Data

Jan. 17, 1996 (FR) .............................. 96 00889

(51) Int. Cl.$^7$ .......................... H01I 29/00; H01I 23/02; H01I 23/48; H01I 21/00; H01I 21/44

(52) U.S. Cl. ...................... 257/531; 257/679; 257/783; 438/111; 438/62; 438/238

(58) Field of Search ............................... 257/679, 531, 257/783; 438/62, 111, 238

(56) References Cited

U.S. PATENT DOCUMENTS 6,617,676 B1 * 9/2003 Oddou et al. ............... 257/679
2003/0064544 A1 * 4/2003 Heinemann et al. ......... 438/106

* cited by examiner

Primary Examiner—David E. Graybill
(74) Attorney, Agent, or Firm—Roland Plottel

(57) ABSTRACT

A process for continuous manufacture of electronic modules (6) including the steps of providing a microcircuit and antenna receiving side on a continuous strip (8) and module surface areas; arranging, e.g., by printing, on the module surface area, a plane spiral antenna (2) wholly arranged to this area; fixing on said strip (8) a microcircuit (7) provided with contact pads (13, 14) after placing an insulator between the microcircuit the strip (8); making an electric connection between the antenna (2) and of the microcircuit.

16 Claims, 8 Drawing Sheets

FIG.5
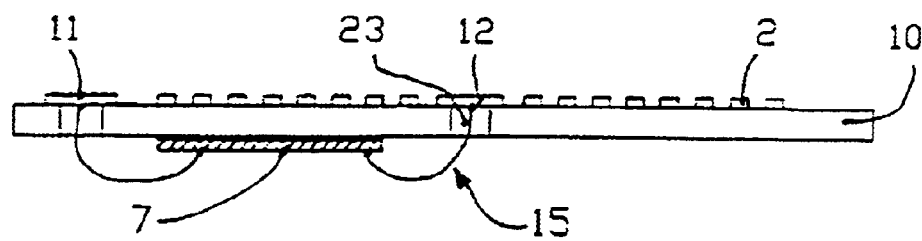
fig.5A
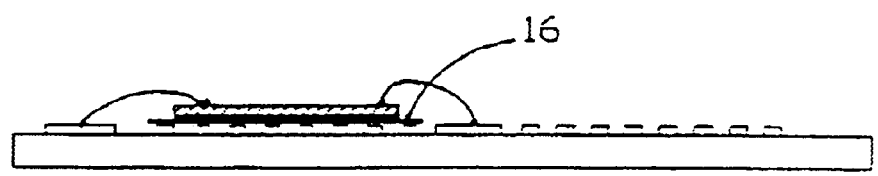
fig.5B
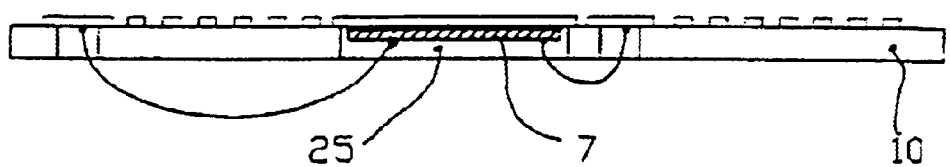
fig.5C
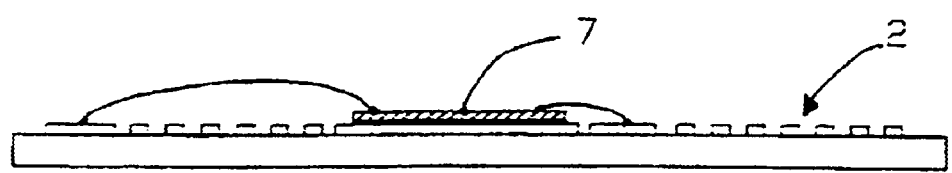
fig.5D

SINGLE RECEIVING SIDE CONTACTLESS ELECTRONIC MODULE CONTINUOUS MANUFACTURING PROCESS

This application is a divisional of application Ser. No. 09/101,049, now abandoned, filed on Jun. 26, 1998, with a §371 date of Oct. 29, 1998, of PCT/FR97/00098 filed on Jan. 17, 1997, and priority of French application number 96/00889 filed on Jan. 17, 1996.

The present invention relates to the field of portable objects such as, in particular, contactless electronic labels and chip cards provided with an electronic module comprising an integrated microcircuit.

The invention also relates to a process for manufacturing such modules and such portable objects.

Portable objects are already known in the form of contactless cards, of ISO format, which are intended to perform various operations such as, for example, payment operations for transport, telephone or other services. These operations are conducted by means of remote coupling between the card's electronic module and a receiver or reader unit. Coupling may be made in reading mode only or in reading/writing mode.

In respect of cards, it is to be noted that the invention does not only concern cards which operate exclusively without contact. It also relates to mixed or hybrid cards which are able to operate in both modes: without and with contact. These mixed cards are intended, for example, for operations of electronic cash dispensing type for which, after being charged with units of value (monetary units, payment units for various services) they are remote debited by a certain number of these units of value when they are passed in the proximity of a reading terminal: this type of debiting assumes contactless operation. If required, these cards can be re-charged in a purpose-designed dispenser.

For the needs of the present disclosure, and for simplification purposes, contactless cards shall be construed as meaning both mixed cards and contactless cards.

Also portable items are known in the form of electronic labels, generally used for various identification or follow-up operations. They are made up firstly of an electronic module with a microcircuit, and secondly of a carrier for this module associated with a coiled antenna operating at relatively low frequency (150 Khz) and of relatively large size in relation to the size of the module.

Such as they are currently produced, portable objects in the form of electronic labels comprise antennae having a large number of turns, often over 100, and their size makes their handling difficult, especially during the label production stages when the antenna is connected by welding to the module's microcircuit.

Similarly, portable objects in the form of contactless cards also have disadvantages. Such as they are currently produced, contactless cards are portable objects of normalized size. A usual, but in no way restrictive, standard for the present invention is the so-called ISO 7810 standard which corresponds to a card of standard format 85 mm long, 54 mm wide and 0.76 mm thick.

In most known contactless cards, each card comprises a card body made up of an assembly of plastic sheets and of an electronic module, embedded in this assembly, comprising an integrated circuit or microcircuit also called a <<chip>> connected via two connection terminals to a coiled antenna of self-inductance type. The chip has a memory and may, in some cases, comprise a microprocessor. The size of the electronic module is substantially smaller than the size of the card, the module generally being positioned in one of the corners of the card, since the mechanical stresses exerted on the module through bending of the card are not as high in the corners as in the centre of the card.

In some known contactless cards, however, provision is made in the card body for a cavity, and provision is made for a module fitted with a coil connected to an integrated circuit, to enable contactless operation of the card.

In this category of contactless cards, an assembly unit is particularly known after DE-A-43 11 493 (AMATECH), for the production of identification units in card format.

According to a first embodiment, a module 21 comprises a module carrier 28 on which is fixed an integrated circuit chip 29. A coil 30 surmounts chip 29 in such manner as to confer contactless identification capacity upon the module. This document specifies that the reading distance between the module and the contactless reader is small. Also, to date no chip card using such a module with antenna has apparently been marketed given the problems of cost and small range which necessarily arise with the described module structure.

Also, it is to be noted that in this document the antenna is in the form of a coiled air antenna inserted over the chip which gives rise to difficulties relating to production, cost, yield and lack of homogeneous performance.

Also, after DE 37 21 822 C1 (PHILIPS) a chip card operating without contact is known, whose design is intended to solve a problem of poor connection between the coil and the integrated circuit. For this purpose, this document describes a chip card without a module, an antenna 4 being fabricated on the semiconductor itself on which an integrated circuit 5 is made. The antenna is made at the same time as the upper tracks of the integrated circuit so that the resulting integrated circuit is 4×6 to 6×8 mm$^2$ carrying 20 small turns.

As a result the effective surface area of the antenna is small, which is detrimental to its range. Also, the card in accordance with this document cannot be produced in economic manner. It is known that the size of an elementary semiconductor pad is one of the main cost factors for mass produced integrated circuits. In this document, however, the minimum size of the integrated circuit incorporating the antenna is of about at least 24 mm$^2$, whereas cheap contactless cards generally use microcircuits of very small size, of about 1 mm$^2$.

A plurality of other processes for making contactless cards are also known, such as those described in French patent applications made by the same applicant and filed under numbers 95 400305.9, 95 400365.3 and 95 400790.2. These patent applications all describe a contactless card provided with an antenna whose size is substantially the same as that of the card and is connected to a micromodule carrying the chip.

Such antenna has the advantage of having a relatively high range for a given reading or writing magnetic field. The equation which determines the electromotive force E appearing at the terminals of the receiver antenna when it breaks an electromagnetic field is of the following type:

$$E_r = I_e (K_e S_e N_e) \cdot (K_r S_r N_r)/D^3 \tag{1}$$

in which K is a constant, S is the surface area of an average turn of antenna, N is the number of turns coiled to form the antenna, indices e and r represent the emitting and receiver sides respectively, and D is the reading distance, i.e. the distance between the card antenna and the antenna of the outside reader.

To cause the circuits of the card chip to operate in order to initialize and conduct a reading operation, voltage E must be exceed a certain threshold, which is generally in the region of 3 Volts.

It will therefore be seen that for a given reading or writing distance D that it is sought to achieve with the contactless card, the surface area of the average turn and/or the number N of antenna turns needs to be increased on the reading and/or writing side.

The efficiency of the antenna, at the chosen frequency for reading or writing, will be determined by the overvoltage coefficient of the antenna coil which is given by the equation:

$$Q=L\omega/R \qquad (2)$$

in which L is the coil inductance which increases with coil diameter and the number of turns, $\omega=2\pi f$ in which f is the reading frequency which is fixed for a given application, and R is the electric resistance of the antenna coil, which is proportional to the length of wire of which it is formed.

Since L and R have contrary effects on the efficiency of the antenna, they tend to offset one another so that the true efficiency factor of the antenna is especially related to the total surface area SN of the antenna.

For a given planar coil size, the number N of turns is limited by the width of a turn and the space between two turns which depend upon the technology used for fabrication.

It is therefore seen that, all other things being equal, the natural tendency to obtain a good antenna for a contactless card, which has been widely used in practice, is to use on the contactless card an antenna in which the size of each turn is as close as possible to the surface of the card. This is why the contactless cards on the market comprise an antenna integrated into the body of the card close to its periphery.

But, as experience in the manufacture of such contactless cards has shown, this choice also leads to a certain number of disadvantages.

Handling an antenna of this size for its integration into the card and its electric connection to the electronic module raises serious technical problems (as in the previously mentioned case of electronic labels).

Despite the techniques used, card and antenna assembly often remain complex and costly since the electronic module and antenna coil must be connected by means that are difficult to automate. Further, the assembly undergoes lamination which is a costly process requiring the addition of resin to sink the coil and module in the card in such manner that they do not appear on the surface of the card and do not deform the upper and lower sheets used for colamination.

Also, the complexity of the process does not give yields comparable with those achieved for the manufacture of contact cards. This is especially so when integrating the restraints required for certain types of card printing and the possible existence of a magnetic stripe or embossing. For certain types of card printing or to make a magnetic stripe on the card, the latter must have virtually perfect planarity with defects of less than 6 $\mu$m. For embossing, materials need to be chosen which are compatible with the card manufacturing process and the antenna must, in particular, leave free the area provided for embossing otherwise it would be damaged during embossing.

Given all these disadvantages connected with current manufacturing methods for contactless cards and electronic labels, which chiefly result in high manufacturing costs, the applicant's engineers set out to determine new processes for manufacturing contactless cards and labels able to avoid all the above-mentioned disadvantages.

More precisely, the purpose of the present invention is to make available non-expensive means which may be used for the manufacture of portable objects of chip card and/or electronic label type.

Another objective of the invention is to provide low-cost manufacturing processes for contactless cards and labels allowing reliable, quality manufacture using automated machines.

A further objective of the invention is to describe a manufacturing process which can be used to obtain perfectly planar contactless cards.

An additional objective of the invention is to make available a process for manufacturing contactless cards which is compatible with all subsequent stages of card body and antenna assembly, in particular with offset card printing, card embossing or the depositing of a magnetic stripe.

For this purpose, the invention sets forth an electronic module of a type that is suitable for producing contactless cards and/or contactless electronic labels, and comprising a carrier substrate to carry an electronic microcircuit, said electronic microcircuit being connectable to an antenna in such manner as to enable contactless operation of the module, characterized in that the antenna is wholly arranged on the module and in that it comprises turns made on the plane of the carrier substrate.

The invention therefore provides a basic part of small size which may be used virtually indifferently for the production of contactless cards of usual format or small-sized electronic labels, regardless of their shape.

According to other advantageous characteristics of the electronic module of the invention:

the antenna is made up of a spiral whose outer size is in the region of 5 to 15 mm, preferably of about 12 mm, whose ends are connected to contacts of the electronic microcircuit, the antenna is made up of a conductor spiral having between 6 and 50 turns, each turn having a width of approximately 50 to 300 $\mu$m, the space between two contiguous turns being of about 50 to 200 $\mu$m.

the spiral forming the antenna is, for example, of substantially circular outer shape, with an outer diameter of about 5 to 15 mm, preferably of about 12 mm. As variants, said spiral is of substantially square outer shape, with an outer side measurement of approximately 5 to 15 mm, preferably approximately 12 mm, or of substantially oval outer shape having a larger measurement of approximately 15 mm and a smaller measurement of approximately 5 mm.

the microcircuit is placed in the centre of the antenna and on the same side of the module as the antenna, the connection terminals of the antenna being connected to respective corresponding contact pads of the module or microcircuit via conductor leads. As a variant, the microcircuit is placed on the same side as the antenna astride the latter's turns, the connection terminals of the antenna being connected to respective corresponding contact pads of the module and electronic microcircuit via conductor leads, and an insulator being placed between the microcircuit and at least the underlying area of the antenna. According to another variant of embodiment of the module, the electronic microcircuit is placed on the side of the module which does not carry the antenna, the connection terminals of the antenna being connected to respective corresponding contact pads of the module or microcircuit via conductor leads crossing over pits made in the module carrier at said connection terminals of the antenna.

on one face of the carrier substrate the electronic module comprises an antenna connected to the microcircuit, and on the other face of the carrier substrate it comprises visible contact pads that are also connected to the microcircuit in such manner as to obtain a hybrid card able to be read and written on via the contacts and/or the antenna.

a tuning capacitor is connected in parallel to the terminals of the antenna and of the electronic microcircuit, and its value is chosen so as to obtain a module operating frequency situated in a range of approximately 1 Mhz to 450 Mhz. In particular, the value of the tuning capacitor is in the region of 12 to 180 picoFarad, and the operating frequency of the module is approximately 13.56 Mhz. Alternatively, the value of the tuning capacitor is in the region of 30 to 500 picoFarad, and the operating frequency of the module is approximately 8.2 Mhz. This tuning capacitor is obtaining by depositing oxidized silicon on the surface of the microcircuit previously coated with an insulator.

The invention also relates to a contactless card and an electronic label comprising a small-sized electronic module with an integrated antenna, in particular of the type described above, and to respective processes for the manufacture of a contactless card and an electronic label of this type.

To produce a contactless card of the invention, all that is required is:

to cut out, from a carrier of electronic modules, a contactless module provided with an antenna and a microcircuit;

to bring said module opposite an opening of substantially the same size as the module made in a card body;

to attach said module in the opening of the card body;

To make an electronic label of the invention, it is alternatively sufficient:

to cut out, from a carrier of electronic modules, a contactless module provided with an antenna and a microcircuit;

to integrate the cut-out electronic module into a protective support.

Alternatively, and in even simpler manner, the invention considers using the production lines of contactless cards for the manufacture of electronic labels. For this purpose, an electronic module needs only to be cut out from a contactless card such as described above, in such manner as to leave around the electronic module some card body substance for the purposes of protecting the module. This technique may be completed by cutting out another part of the same shape, for example from the same card, then fixing this part against the first in such manner as to surround and protect the module.

The invention will be better understood with reference to the following description given as a non-restrictive example and to the appended drawings in which:

FIGS. 5a to 5D show a section view of several variants of embodiment of an electronic module provided with an antenna, according to the invention.

Similar parts are given the same reference numbers in all figures.

Figure 1:
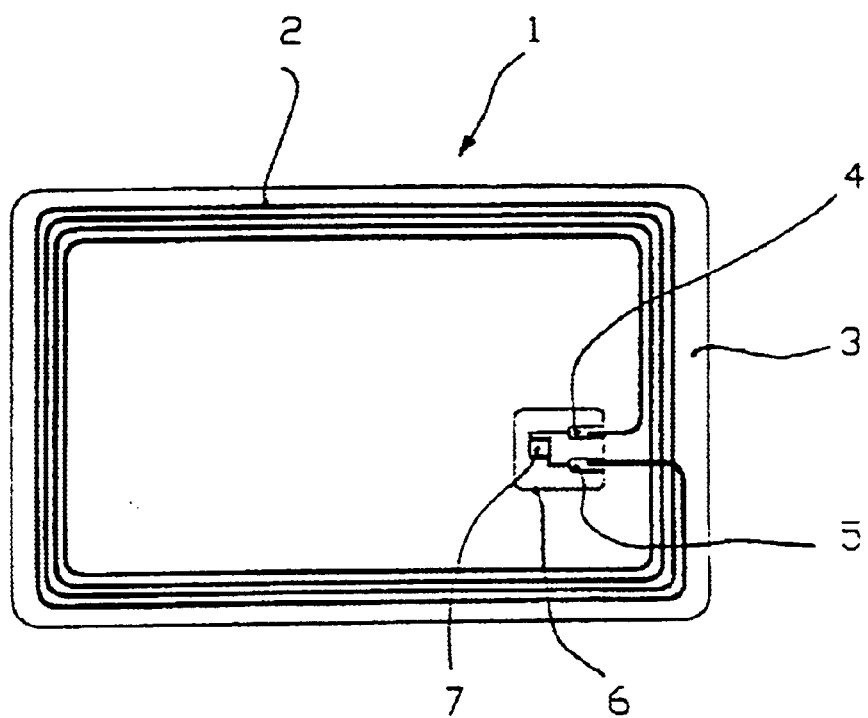
FIG. 1 shows a contactless card of the state of the art.

Reference is made to FIG. 1 showing a diagram and plan of a contactless card 1 having the type of those actually marketed. As can be seen, antenna 2 in the form of a large-sized coil, slightly smaller than the size of the card, is integrated into the card body 3, and two end of the coil of antenna 2 are connected to supply contacts 4, 5 of an electronic module 6 carrying an integrated microcircuit 7 also called a chip.

The coil is shown to scale, except in respect of the number of turns, only four turns being shown. To assemble such coil 2 with card body 3, it is required to conduct complex, costly lamination or injection operations with the above-mentioned disadvantages. With this kind of antenna it is possible to read card information from a distance of 70 mm onwards at a frequency of a few Mhz.

Unlike the card in FIG. 1, the general underlying principle of the invention consists of no longer using the large-sized antennas currently used for contactless cards, in order to overcome the above-mentioned disadvantages. The invention also sets out, in order to reach the desired objectives of reliability and low manufacturing cost, to use certain principles and the production lines used for the manufacture of contact cards, such manufacture being currently well circumscribed and allowing low manufacturing costs to be obtained.

Figure 2:
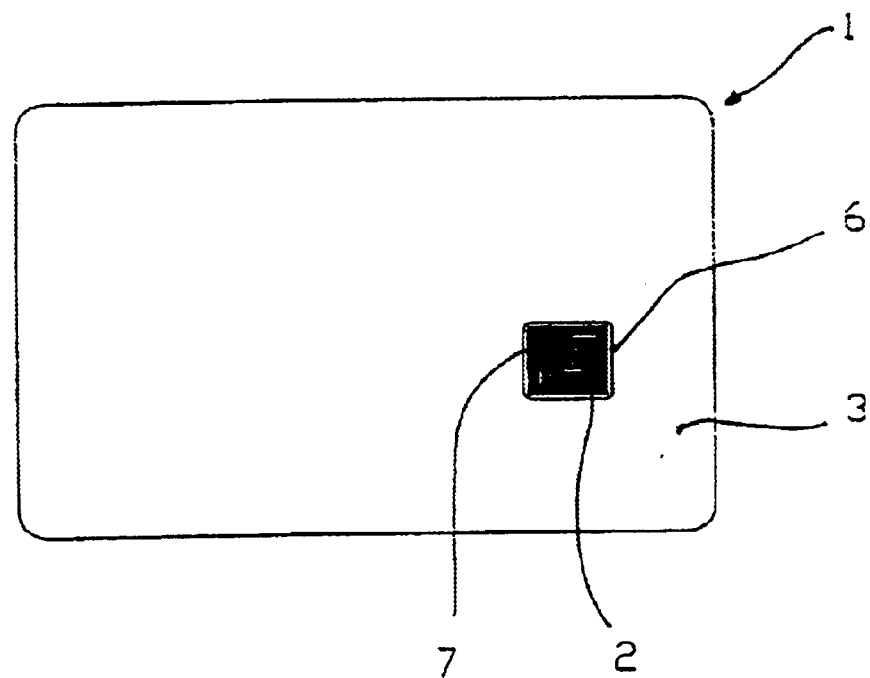
FIG. 2 shows a contactless card of the invention

A diagram of the solution put forward is shown by the card 1 in FIG. 2. It consists of using a particular module 6 of chip card combining on one same small-sized carrier the electronic functions of conventional chip modules, and the function of transmitting/receiving antenna for contactless transmission of information between the card and an outside reading/writing device (not shown).

The size of module 6 is compatible with known manufacturing processes used to manufacture contact cards, in its thickness and plane, length and width.

Obviously, for a module provided with an antenna to be feasible, the size of the antenna obtained must, contrary to the teaching of the state of the art, be compatible with the size of the module, while maintaining a number of turns able to assure electromagnetic transmission at sufficient distance, in the region of a few centimeters. For this purpose, the antenna is made in the form of a spiral made up of a group of turns lying directly on the carrier substrate and substantially in the same plane, which excludes air coils as taught by some documents of the prior art mentioned above.

In order to best adapt to the shape of the module and to available surface area, the antenna may have an outer turn of substantially square, rectangular, circular or oval shape or any other suitable shape. The two ends of the antenna are connected to the supply terminals of an integrated circuit, in particular a memory and/or microprocessor, also positioned on the module as shown under reference 7 in the diagram in FIG. 2 but shown in more detail in FIGS. 4 to 6.

Figure 3:
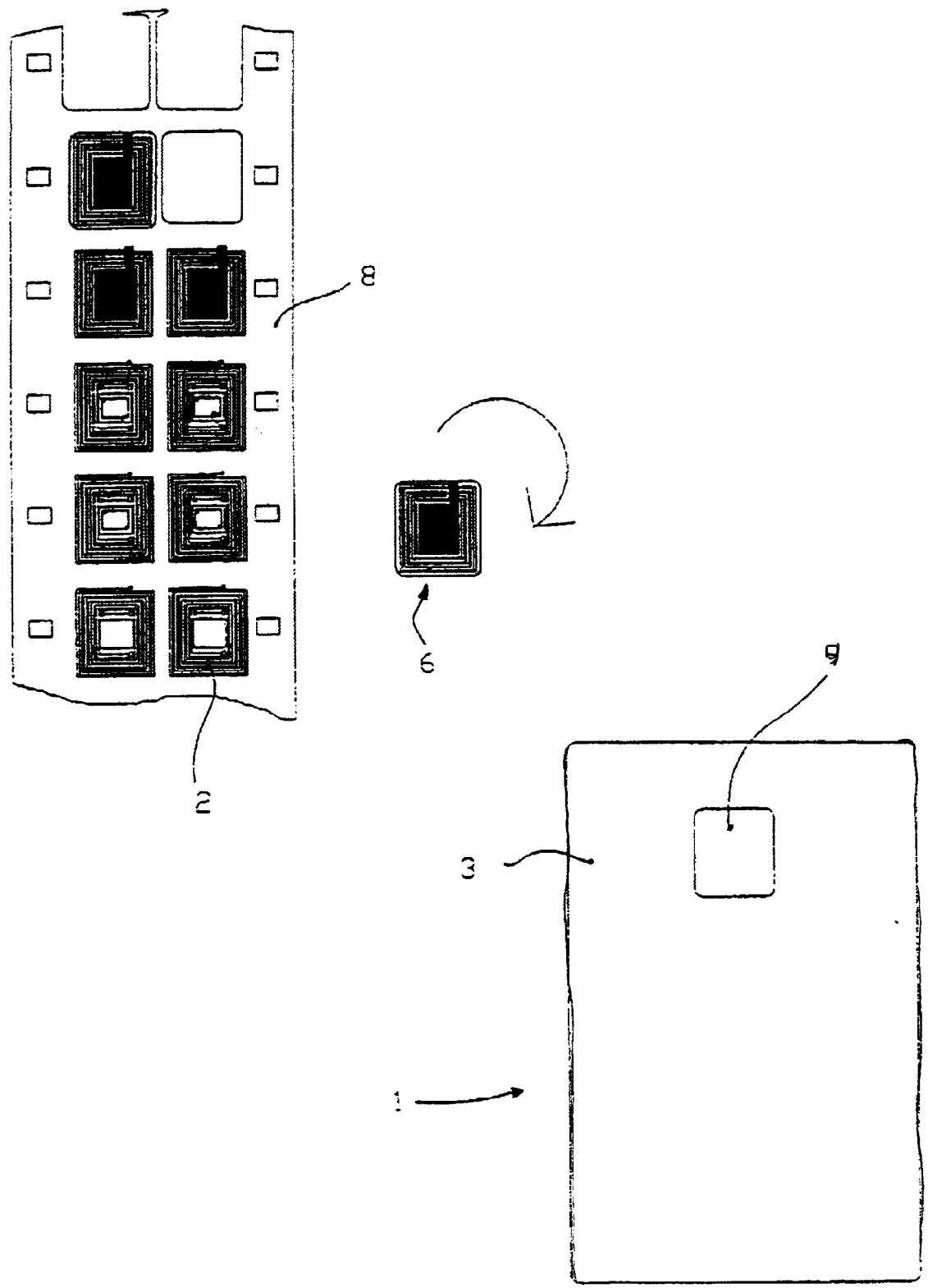
FIG. 3 shows a strip used for the continuous manufacture of electronic modules of the invention, intended for use in contactless cards or electronic labels of the invention, and a card intended to house the module.

With reference to FIG. 3, illustrating the separation of an electronic module of the invention from a strip 8 comprising a plurality of modules 6 placed for example in two rows. The fabrication of conventional electronic modules on such strips is well known as such in the sphere of contact card production and will not therefore be further described.

A module 6 of the invention, for example of the type comprising an integrated circuit 7 <<astride>> the turns of an antenna 2 in square spiral shape, is detached from strip 8 by a cutting process, for example mechanical cutting. The cut-out module is taken by automated means that are not shown but are known, and is brought preferably with the reverse side facing upwards (integrated circuit and antenna facing the bottom of the opening of the card body) opposite a blind opening 9 made in the card body 3 of a contactless chip card 1. Attachment of module 6 in opening 9 provided is made by gluing, welding or any other appropriate means.

The result is a contactless card according to the invention provided with an antenna 2 positioned at electronic module level 6 and whose fabrication is chiefly limited to the stages which have just been described, followed, obviously, by any usual printing and personalisation stages.

FIGS. 4A to 4G show in more detail several module variants intended to be integrated into cards for the production of contactless cards, or to be integrated into a support of a different form to the card, for example to manufacture electronic labels.

A module 6 is made up of a conventional carrier substrate 10 (in relatively flexible film, mylar, epoxy or capton) on which is added not a coil but an antenna pattern 2 which may be made in several manners as will be explained below. Antenna 2 is, for example, made by stamping from a copper sheet followed by assembly of the stamped sheet with the carrier substrate. Carrier substrate 10 and antenna 2 are possibly assembled in precise manner, using known substrate guiding and positioning means.

Antenna 2 may also be obtained by photochemical etching of the antenna pattern, or by depositing metallic matter on a flexible film forming substrate 10. The choice of a suitable carrier substrate 10 has consequences on the thickness of the module and is chiefly dependent upon the intended use of the module. This choice is fully within the scope of men of the art.

In one variant put forward for electronic module 6, antenna 2 is made up of a copper stripe approximately 15 μm to 70 μm thick, made in spiral form, with spaces between the turns of the same size. Ends 11, 12 of this spiral are preferably widened so as to form contact pads for connection with microcircuit 7.

Figure 4A:
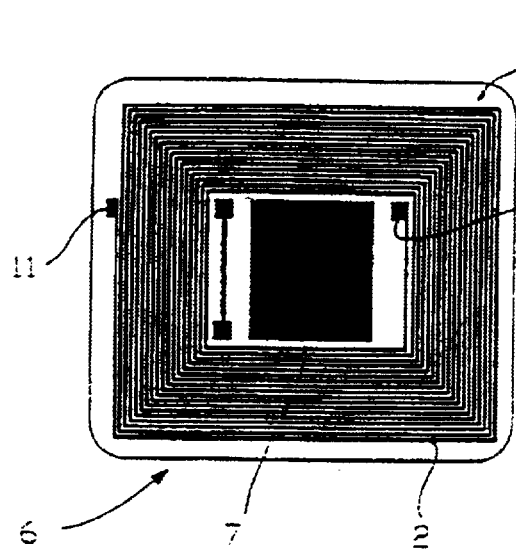
FIGS. 4A to 4G show several variants of embodiment of an electronic module of the invention, able or intended to be incorporated into the body of a contactless card or into an electronic label.
Figure 4B:
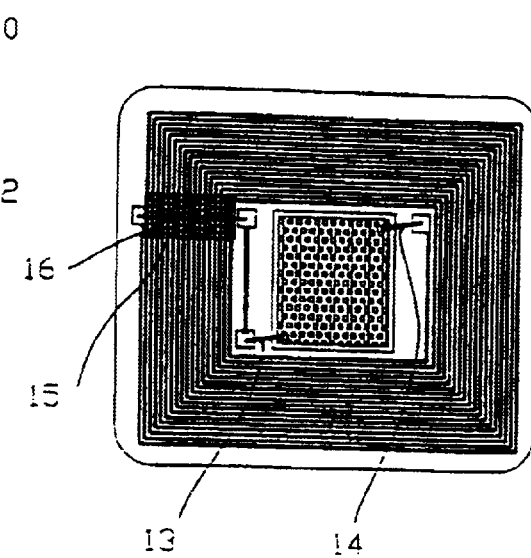
Figure 4C:
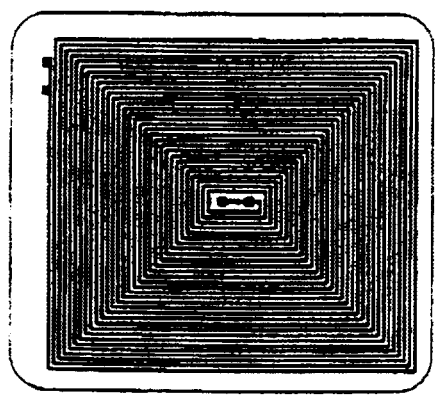
Figure 4D:
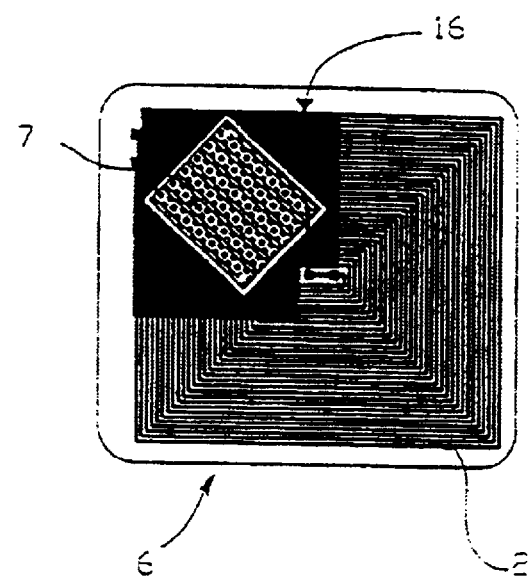

Provision is made for several variants in the respective positioning of the microcircuit and antenna. Under a first embodiment of the module 6 that is practical and uses little space (FIG. 4A) chip 7 is glued in the middle of antenna 2. FIG. 4B also shows connecting conductor leads 13, 14 to connect a respective terminal of chip 7 to a corresponding respective end 11, 12 of the antenna. For this purpose a lead 15 needs to be passed above the antenna lines. For this purpose an insulator 16 is previously deposited, in particular by screen processing between the corresponding stripe zone and connector lead 15.

Under another embodiment of module 6 (FIG. 4C) antenna 2 takes up the whole side of the module and has no free space in its centre. In this case, the invention provides for gluing microcircuit 7 either onto the module face with no antenna or onto the same face as the antenna (FIG. 4D), after placing an insulator (dark part 16) between antenna 2 and microcircuit 7.

Figure 4E:
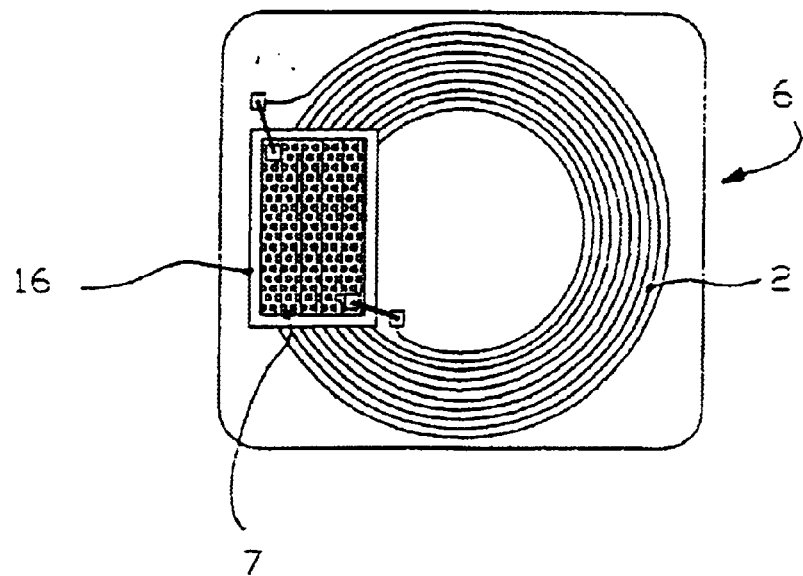

FIG. 4E shows a variant of electronic module 6, in which antenna 2 has a round spiral shape, microcircuit 7 being positioned over the plane of the turns with interpositioning of an insulator 16. With this configuration it is possible to minimize the length of connection leads between the antenna and the microcircuit.

Figure 4F:
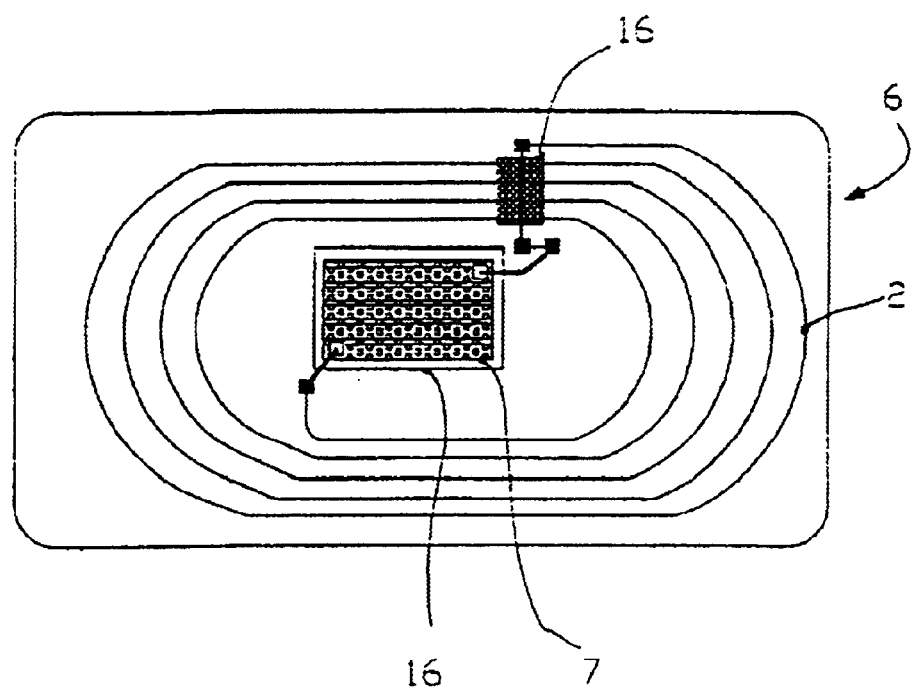

FIG. 4F illustrates an additional variant of module 6 of the invention, particularly adapted to cases in which an elongated or rectangular module is required. In this case, the pattern of antenna 2 has a substantially oblong spiral shape, microcircuit is preferably located in the centre of the antenna and the connections between the terminals of the microcircuit and the coil pads are made as described for FIG. 4B.

It is to be noted that the connection between the chip pads and the contact terminals of the antenna may be made using a conventional connection technique for conductor leads, such as for example so-called <<bonding>> consisting of conductor leads welded between a pad of the microcircuit and a respective terminal of the antenna, or using the so-called <<flip-chip>> technique consisting of adding the microcircuit onto the module substrate 10 with the face carrying the antenna and microcircuit glued onto the substrate. Resin protection of the contacts is then achieved using conventional processes for producing contact chip cards.

Figure 4G:
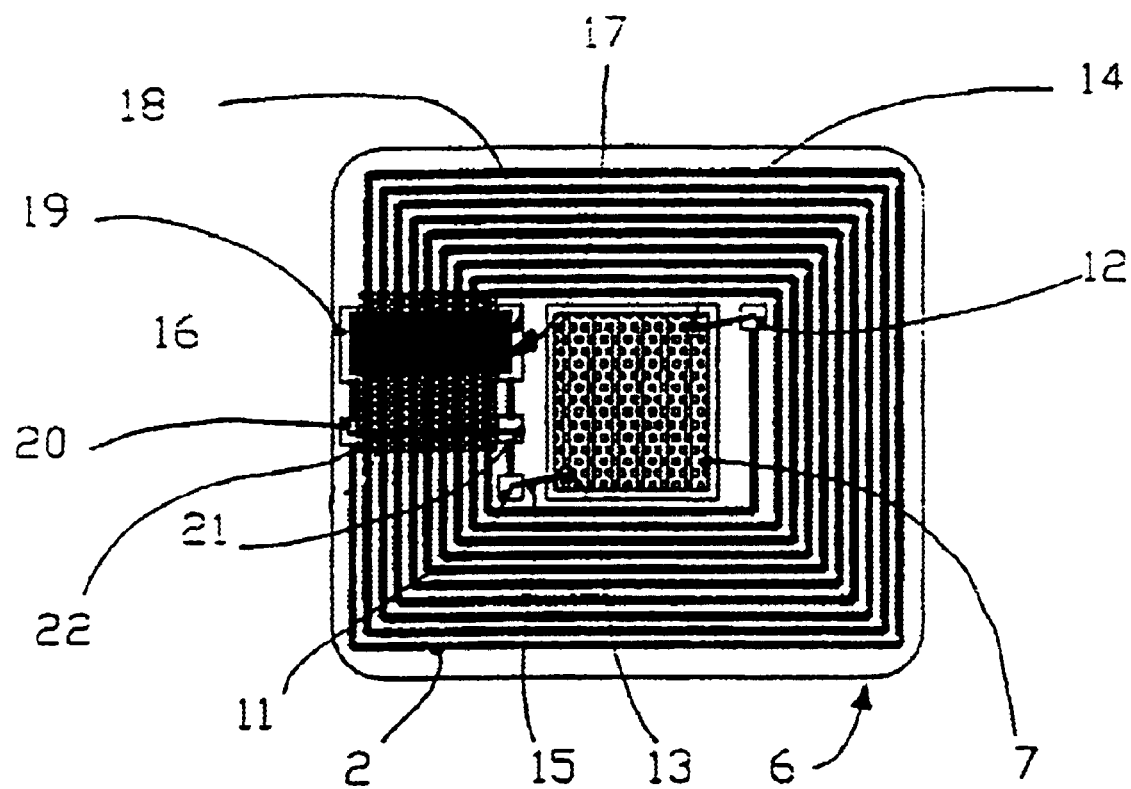

FIG. 4G gives a more detailed view of an electronic module 6 of the invention, on which a tuning capacitor 17 has been fabricated astride the antenna turns, by depositing on top of insulating layer 16 (shaded part). In order to connect the capacitor in parallel between terminals 11, 12 of antenna 2 and pads 13, 14 of the microcircuit, a terminal 18 of capacitor 17 is connected to terminal 12 and pad 14, and the other terminal 19 of capacitor 17 is connected to terminal 11 and pad 13 via intermediate pads 20, 21 connected by an intermediate connection 22 located between intermediate pads 20, 21 and made over insulating layer 16 in such manner as not to short-circuit the antenna turns.

Obviously, other provisions of tuning capacitor 17 are possible. In particular, it can be integrated onto microcircuit 17 itself, at the design stage of the latter, which will reduce the number of manufacturing stages of module 6.

The antenna pattern is determined so that it will allow operation at high frequency, in the Mhz region, the value of tuning capacitor 17 being chosen to obtain a determined operating frequency of antenna 2 within a high frequency range of approximately 1 Mhz to 450 Mhz. In one example of embodiment, allowing a usual operating frequency of approximately 13.56 Mhz to be obtained, the value of tuning capacitor 17 is in the region of 12 to 180 picoFarad. In another variant allowing operation at 8.2 Mhz, the value of the tuning capacitor is in the region of 30 to 500 picoFarad.

Figure 6A:
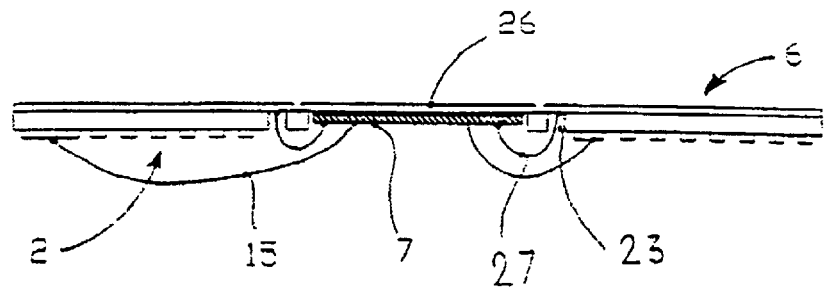
FIG. 6 shows a section view of a module for a contact and contactless hybrid card.
Figure 6B:
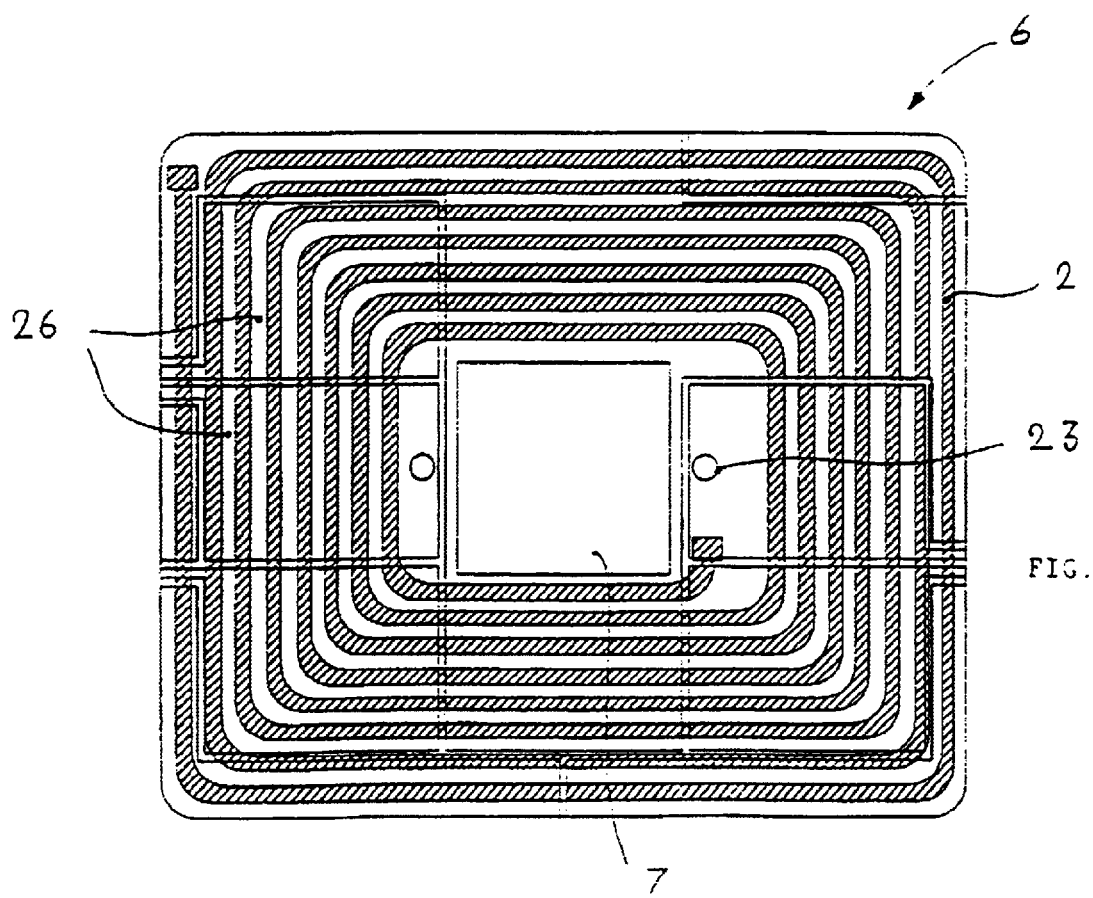

FIGS. 5 and 6 show various embodiments of module 6, shown in section view. In FIG. 5 a metal grid has been used as an antenna that is cut out and then glued onto carrier substrate 10. Mechanical cutting of a spiral antenna is suitable for stripe widths that are not too fine, currently in the region of at least 300 μm.

In FIG. 5A, microcircuit 7 and antenna 2 are situated on the two opposite faces of carrier substrate 10, contact terminals 11, 12 of antenna 2 being connected to pads of the microcircuit (not shown) via connection leads 15 brought through pits 23 made in carrier 10.

In FIG. 5B, microcircuit 7 is on the same side as antenna 2 and is deposited over its turns with interpositioning of an insulator 16. In FIG. 5C, microcircuit 7 is placed in a cavity 25 made for this purpose in carrier 10 of the module, which allows the thickness of the module unit 6 to be reduced. In FIG. 5D, microcircuit 7 is simply glued in the centre of antenna 2, as is also shown in FIGS. 4A, 4B. In all cases, the whole of the antenna is positioned on carrier substrate 10 forming part of the module, and the microcircuit is added onto this substrate and antenna structure.

It is to be noted that in order to further reduce the thickness of module 6, it is possible to use for antenna 2, instead of a cut-out metal grid, a grid that is etched in or deposited by metallisation or otherwise on a suitable carrier substrate 10.

FIG. 6, which is a top section view of another embodiment of electronic module 6, in order to obtain a hybrid contact and contactless module, particularly adapted to the manufacture of hybrid cards. In this module, microcircuit 7 and the antenna are placed on a first face of carrier substrate 10 of the module, as already described in respect of FIG. 5. Also, contacts 26, identical to contacts for contact cards, are connected to corresponding pads of the microcircuit by conductor leads 27. The microcircuit can communicate with the outside using contacts 26 or antenna 2 depending upon the outside signal applied. All the effective components for the operation of the hybrid card, including antenna 2, are therefore arranged on a hybrid module 6 of small size, able to be inserted, i.e. to be incorporated into a card body.

Advantageously, two modules 6 of the one of the above-described types, may be made side by side in the width of a standard film 10 (i.e. 35 mm), but other arrangements of module 6 on a carrier strip 8 come within the limits of the invention. Each module 6 may then be transferred onto a card body 3 of standard ISO format using conventional processes for transferring modules to card bodies, such as used for the production of contact cards.

Alternatively, modules 6 may be used for the production of electronic labels, of the type used for object identification. If necessary, after being cut from carrier strip 8, modules 6 are protected by a protective resin coating or any other suitable material, allowing small-sized labels to be obtained at low cost. Obviously, the modules may also be integrated or fixed onto different or more voluminous supports (keys, packaging, etc.) in relation to the intended application.

Figure 7:
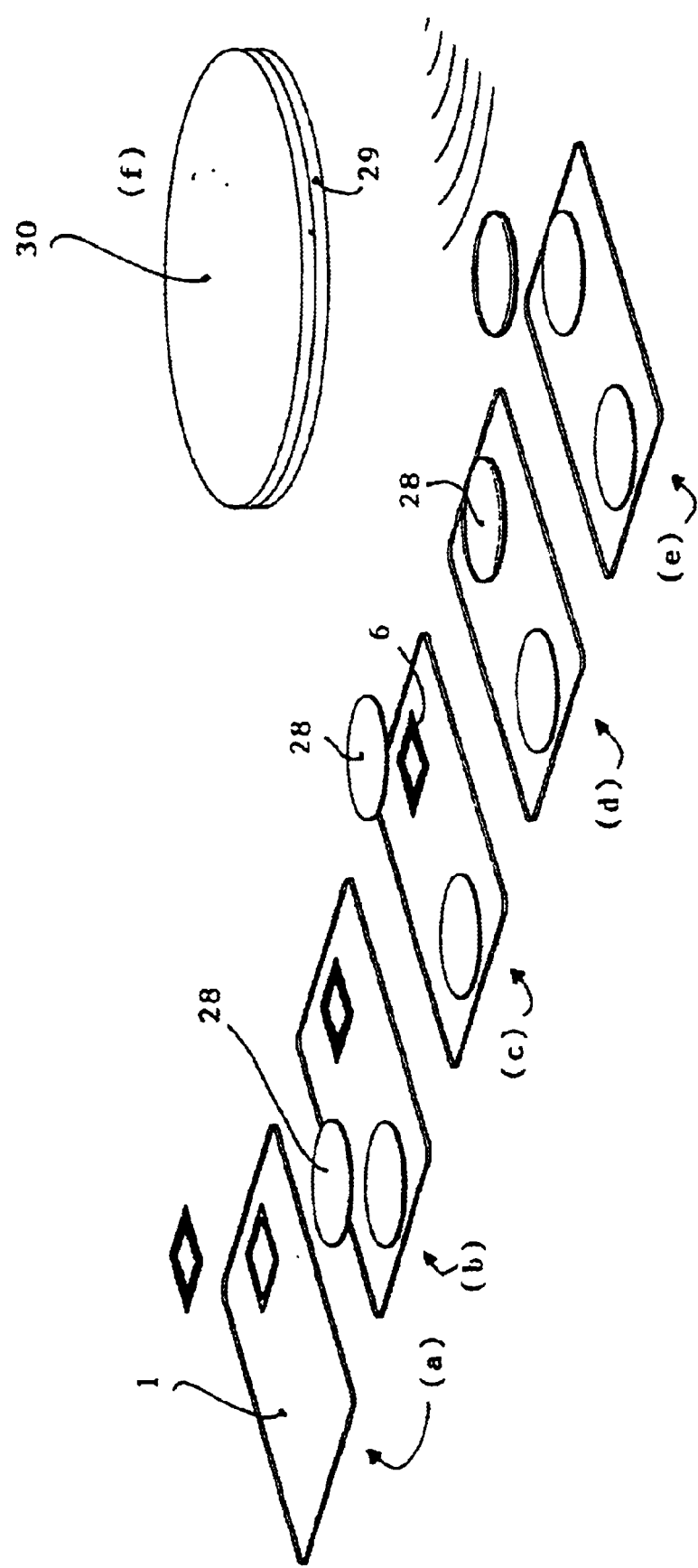
FIG. 7 shows the stages of a manufacturing process for a variant of electronic label using the electronic module of the inventions.

With reference to FIG. 7. As an interesting variant of the label manufacturing process, in order to take advantage of scale savings and production lines for contact cards, while nevertheless using modules 6 of the invention, it is also possible to produce electronic labels using a process which consists solely of the above-described cutting-out stage of electronic module 6 from a contactless card 1 incorporating such module, in such manner as to leave only some card body substance around electronic module 6 for the purpose of protecting module 6. In this way, from mass-produced contactless cards of the invention it is easy to obtain electronic labels having the thickness of a card but with much more reliable plane measurements.

In this case, however, a major disadvantage becomes apparent for certain applications: when simply cut out from a contactless card, the label is only protected on one side by the very minimal protection provided on one side of the cavity by a veil of plastic matter a hundred or so micrometers thick, whereas the other face of the module is exposed. To remedy this drawback, it is possible in judicious manner, as shown in FIG. 7(a), to cut out from one part of card 1 which at all events would be discarded, a first part 28 having the size of the planned label format. Then, as shown in FIG. 7(b), this part 28 is transferred onto the face of the label on which module 6 is visible and non-protected. Part 28 is mounted on card 1 as shown in FIG. 7(d) using any appropriate technique, in particular by gluing or ultrasound welding. Finally, as shown in FIG. 7(e) a part 29, is cut out from the same card having the same size and at the same level as part 28. In this way a symmetrical electronic label can be obtained at low cost, of which an enlarged diagram is given in FIG. 7(f). Obviously parts 28 and 29 could be cut out separately and subsequently assembled.

Such label 30 incorporates a module 6 protected on both sides, and may be graphically personalized on both sides to produce labels that can be used in games or any other applications.

In respect of the performance of the modules, cards and labels of the invention, theoretical and practical results show that on module 6 a performing antenna is obtained able to operate over the frequency range of 1 to 450 Mhz.

In order to obtain required connection performances for a given application, only a sufficiently high modulation frequency needs to be used (for example 13.56 Mhz) to obtain acceptable performances at reading/writing distance.

If, for example, the frequency of 13.56 Mhz is considered, which is frequently used in electronic cash dispensing applications, the performances obtained are fully remarkable. A chip 7 mounted using this process and associated with antenna 2, can currently achieve an operating distance of approximately 50 mm whereas the same chip mounted with a conventional coil of card size can reach approximately 70 to 75 mm. This difference is not critical for most currently considered contactless applications. Also, this performance may be substantially improved by working on transmission circuits and the recovery of electromagnetic energy of the module and outside readers.

According to one practical embodiment, the module size is in the region of 12 mm×12 mm, but it is possible to consider slightly larger, elongated formats to increase performance, or even optimising the reader antenna or even the chip antenna itself in respect of its consumption to improve performance and attain that of a larger antenna.

With the concept of the invention, if module 6 is used to manufacture cards, card integrity is maintained throughout the entire production process. Consequently, the card body may easily be used in conventional manner to house a magnetic stripe. Also, it may be printed using any existing processes with no particular restraints other than those that are known for the manufacture of a conventional card.

Also, the choice of material for the card body is in no way restricted: it can be adapted to the needs of various applications given consideration.

Consequently, the invention simultaneously solves all the above-described disadvantages connected with the production of contactless modules for contactless cards, in particular in respect of cost, space requirement, printing, compatibility with embossing or the insertion of a magnetic stripe. The small size of the antenna brings comparable advantages for the production of electronic labels, that are not dependent upon the shape of a card body.

The economic advantage of the invention is undeniable; it enables the same production lines to be used for the production of electronic modules with integrated antennae, and of operational, contactless electronic labels and cards at a fraction of the current cost of processes used to produce contactless cards or labels, at every stage of their manufacture.

Other subsidiary advantages related to the module, the contactless label and card of the invention and to their manufacturing processes lie in the fact that no antenna coil handling, no tin welding, no precise positioning of the coil and no printing before insertion are required.

What is claimed is:

1. A process for continuous manufacture of electronic modules (6) for smart objections such as tags, hybrid cards, contactless cards or the like, that comprises the steps of:
   a) providing a continuous strip (8) defining a module substrate carrier (10), said strip (8) being designed to be able to receive a plurality of modules (6);
   b) providing a microcircuit and antenna receiving side on the continuous strip (8);
   c) providing said receiving side with a plurality of module surface areas;

d) arranging on at least one module surface area, a plane spiral antenna (2) of the best size and shape wholly arranged to available module surface area;
e) providing this antenna (2) with connection terminals (11, 12), while arranging the plane spiral antenna (2);
f) providing a microcircuit fixing means on at least one module surface area of the receiving side of the module substrate carrier (1) and/or on the plane spiral antenna (2); said microcircuit fixing means being made of electrically insulating material;
g) fixing on said carrier (1) and/or said antenna (2) a microcircuit (7) provided with contact pads (13, 14);
h) the contact pads (13, 14) being placed upwards while the microcircuit fixing means forming an insulator placed between the microcircuit the underlying area of the receiving side of the module substrate carrier (10); and
i) making an electric connection between connection terminals (11, 12) of antenna (2) and corresponding contact pads (13, 14) of the microcircuit.

2. The process according to claim 1, wherein each of the module surface areas is designed to be of the best size and shape to be arranged on and/or in a smart object.

3. The process according to claim 1, wherein the plurality of module surface areas are placed in two rows on the receiving side of the continuous strip (8).

4. The process according to claim 1, wherein the antenna and/or the connections are arranged on the module surface area by printing of a conductive material.

5. The process according to claim 1, wherein the microcircuit is placed in the center of the antenna on the same side of the module as the antenna, the connection terminals of the antenna being connected to respective corresponding contact pads of the module or microcircuit via conductor leads.

6. The process according to claim 1, wherein the microcircuit is placed in the center of the antenna on the same side of the module as the antenna, the connection terminals of the antenna being connected to respective corresponding contact pads of the module or microcircuit via conductor prints, and an insulator being placed between the microcircuit and at least the underlying area of the antenna.

7. Processing according to claim 1, wherein the microcircuit is placed on the same side as the antenna astride the latter's turns, the connection terminals of the antenna being connected to respective corresponding contact pads of the module and electronic microcircuit via conductor leads.

8. The process according to claim 1, wherein the microcircuit is placed on the same side as the antenna astride the latter's turns, the connection terminals of the antenna being connected to respective corresponding contact pads of the module and electronic microcircuit by conductor prints, and an insulator being placed between the microcircuit and at least the underlying area of the antenna.

9. The process according to claim 1, wherein a resin protection of the contacts is achieved; this resin being placed on the module surface area.

10. The process for manufacturing smart objects such as tags, hybrid cards, contactless cards or the like, the smart object comprising at least one electronic module (6) according to claim 1.

11. A process for the continuous manufacture of electronic modules for smart objects such as tags, hybrid cards, contactless cards or the like, comprising the steps of:
a) providing a continuous strip (8) defining a module substrate carrier (10), said strip (8) being designed to be able to be made into a plurality of modules (6); and having one side for receiving a microcircuit and antenna, said receiving side having a plurality of module surface areas;
b) arranging on at least one module surface area, a plane spiral antenna (2) with connection terminals (11, 12) of the best size and shape wholly arranged to available module surf ace area;
c) providing a microcircuit fixing means on at least one module surface area of the receiving side of the module substrate carrier (10) and/or on the plane spiral antenna; said microcircuit fixing means being made of electrically insulating material;
d) fixing on said carrier (10) and/or said antenna (2) a microcircuit (7) provided with contact pads (13, 14); the contact pads (13, 14) being placed upwards while the microcircuit fixing means forming an insulator being placed between the microcircuit the underlying area constituted by the receiving side of the module substrate carrier (10);
e) making an electric connection between connection terminals (11, 12) of antenna (2) and corresponding contact pads (13, 14) of the microcircuit;
said plurality of module surface areas being placed in two rows on the receiving side of the continuous strip (8); said antenna and/or the connections are arranged by on the module surface area by printing of a conductive material; said microcircuit is placed on the same side of the strip as the antenna astride the antenna turns; said electric connections being conductor leads or conductor prints; and wherein conductor prints, and an insulator being placed between the microcircuit and at least the underlying area of the antenna; and
f) placing a resin protection of the contacts is achieved; this resin being placed on the module surface area.

12. The process according to claim 11, wherein the microcircuit is placed in the center of and on top of the antenna, and on the same side of the module as the antenna, the connection terminals of the antenna.

13. A device made in accordance with the method of claim 11.

14. The device of claim 13, wherein said device is selected from the group consisting of tags, hybrid cards, contactless cards, and smart cards.

15. A process for the manufacture of an electronic label comprising the steps of printing on a continuous strip, a plurality of spiral antennae, the outer dimensions of the antennae being in the range of 5 to 15 mm, depositing an insulating layer over the antenna, depositing microcircuits each having at least two terminals on top of the layer with each microcircuit over a different one of the antennas, connecting the terminals of the microcircuit to the underlying antenna, and separating from the strip the label that comprises a portion of said substrate with one of said antennas and the microcircuit and connections thereof.

16. Process according to claim 15, wherein said antenna is a spiral whose outer size is in the region of 5 to 15 mm, having between approximately 6 and approximately 50 turns, the width of each turn being of about 50 to 300 $\mu$m, and the space between two contiguous turns being in the region of 50 to 200 $\mu$m.

* * * * *